(12) United States Patent
Sugiura et al.

(10) Patent No.: US 9,048,400 B2
(45) Date of Patent: Jun. 2, 2015

(54) LIGHT-EMITTING DEVICE WITH A WAVELENGTH CONVERTING LAYER AND METHOD FOR MANUFACTURING THE SAME

(75) Inventors: Kenji Sugiura, Osaka (JP); Hideo Nagai, Osaka (JP); Tetsushi Tamura, Osaka (JP); Kenji Ueda, Nara (JP); Kazuyuki Okano, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 303 days.

(21) Appl. No.: 12/444,832

(22) PCT Filed: Oct. 12, 2007

(86) PCT No.: PCT/JP2007/069923
§ 371 (c)(1),
(2), (4) Date: Apr. 8, 2009

(87) PCT Pub. No.: WO2008/044759
PCT Pub. Date: Apr. 17, 2008

(65) Prior Publication Data
US 2010/0038665 A1    Feb. 18, 2010

(30) Foreign Application Priority Data

Oct. 12, 2006 (JP) ................................ 2006-279103

(51) Int. Cl.
*H01L 33/00* (2010.01)
*H01L 33/50* (2010.01)
(Continued)

(52) U.S. Cl.
CPC ............. *H01L 33/508* (2013.01); *H01L 33/54* (2013.01); *H01L 33/58* (2013.01); *H01L 2933/0091* (2013.01); *H01L 2924/0002* (2013.01)

(58) Field of Classification Search
CPC ................... H01L 33/508; H01L 2933/0091; H01L 333/58
USPC ................... 257/98–100, E33.034, E33.061; 438/29; 313/501–503
See application file for complete search history.

(56) References Cited

U.S. PATENT DOCUMENTS 6,650,044 B1    11/2003   Lowery
6,841,933 B2 *   1/2005   Yamanaka et al. ............ 313/512
(Continued)

FOREIGN PATENT DOCUMENTS

EP          1 710 847       10/2006
JP          2001-135861     5/2001
(Continued)

*Primary Examiner* — Kimberly Rizkallah
*Assistant Examiner* — Alexander Belousov
(74) *Attorney, Agent, or Firm* — Hamre, Schumann, Mueller & Larson, P.C.

(57) ABSTRACT

A light-emitting device (1) includes a base (10), a light-emitting element (11) placed on the base (10), and a wavelength converting layer (12) that covers the light-emitting element (11). The wavelength converting layer (12) includes a wavelength converting portion (13) that converts a wavelength of light from the light-emitting element (11), and a light guide portion (14) made of a light-transmitting material, and the light guide portion (14) extends from a light-emitting element (11) side to a light extraction side of the wavelength converting layer (12). Consequently, it is possible to provide a light-emitting device that can be miniaturized and reduced in thickness easily and can prevent a decrease in the light extraction efficiency.

6 Claims, 14 Drawing Sheets

(51) Int. Cl.
*H01L 33/54* (2010.01)
*H01L 33/58* (2010.01)

(56) References Cited

U.S. PATENT DOCUMENTS

| | | | |
|---|---|---|---|
| 6,943,380 B2 * | 9/2005 | Ota et al. | 257/100 |
| 7,029,935 B2 * | 4/2006 | Negley et al. | 438/29 |
| 7,250,715 B2 * | 7/2007 | Mueller et al. | 313/485 |
| 7,332,746 B1 * | 2/2008 | Takahashi et al. | 257/98 |
| 7,420,323 B2 * | 9/2008 | Krummacher | 313/502 |
| 7,863,635 B2 * | 1/2011 | Andrews et al. | 257/98 |
| 2003/0038295 A1 * | 2/2003 | Koda | 257/98 |
| 2003/0123155 A1 | 7/2003 | Quake et al. | |
| 2003/0132701 A1 * | 7/2003 | Sato et al. | 313/503 |
| 2004/0104391 A1 * | 6/2004 | Maeda et al. | 257/79 |
| 2004/0196569 A1 * | 10/2004 | Quake et al. | 359/656 |
| 2004/0212291 A1 * | 10/2004 | Keuper | 313/483 |
| 2004/0217692 A1 * | 11/2004 | Cho et al. | 313/503 |
| 2004/0256974 A1 * | 12/2004 | Mueller-Mach et al. | 313/485 |
| 2005/0227388 A1 * | 10/2005 | Setlur et al. | 438/22 |
| 2006/0006791 A1 * | 1/2006 | Chia et al. | 313/498 |
| 2006/0258028 A1 * | 11/2006 | Paolini et al. | 438/22 |
| 2006/0267042 A1 * | 11/2006 | Izuno et al. | 257/100 |
| 2007/0075306 A1 * | 4/2007 | Hayashi et al. | 257/13 |
| 2007/0159061 A1 * | 7/2007 | Krummacher et al. | 313/501 |
| 2007/0172772 A1 * | 7/2007 | Ozawa et al. | 430/321 |
| 2007/0259206 A1 * | 11/2007 | Oshio | 428/690 |
| 2007/0269586 A1 * | 11/2007 | Leatherdale et al. | 427/66 |
| 2008/0142820 A1 * | 6/2008 | Edmond et al. | 257/98 |
| 2008/0217639 A1 * | 9/2008 | Kim et al. | 257/98 |
| 2008/0232085 A1 * | 9/2008 | Luettgens et al. | 362/84 |
| 2008/0303410 A1 | 12/2008 | Kaneda et al. | |
| 2009/0206353 A1 * | 8/2009 | Okazaki | 257/98 |

FOREIGN PATENT DOCUMENTS

| | | | | |
|---|---|---|---|---|
| JP | 2004-349647 | | 12/2004 | |
| JP | 2004349647 A | * | 12/2004 | H01L 33/00 |
| JP | 2005-093601 | | 4/2005 | |
| JP | 2005-285871 | | 10/2005 | |
| JP | 2005-290164 | | 10/2005 | |
| JP | 2005-317873 | | 11/2005 | |
| JP | 2006-049799 | | 2/2006 | |
| JP | 2006049799 A | * | 2/2006 | H01L 33/00 |
| JP | 2006-100472 | | 4/2006 | |
| JP | 2006-111823 | | 4/2006 | |
| JP | 2006-148051 | | 6/2006 | |
| JP | 2006-173433 | | 6/2006 | |
| JP | 2006-179684 | | 7/2006 | |
| WO | WO 2005103199 A1 | * | 11/2005 | C09K 11/77 |
| WO | WO 2005106538 A1 | * | 11/2005 | G02B 3/00 |

* cited by examiner

LIGHT-EMITTING DEVICE WITH A WAVELENGTH CONVERTING LAYER AND METHOD FOR MANUFACTURING THE SAME

TECHNICAL FIELD

The present invention relates to a light-emitting device using a light-emitting element and a method for manufacturing the same.

BACKGROUND ART

Light-emitting elements such as a light-emitting diode (hereinafter, referred to as a "LED") are used in various types of light-emitting devices. The LED may replace an existing light source that uses discharge and radiation, due to the recently increased luminous flux, as well as the smaller size and higher efficiency compared with those of the existing light source. Furthermore, the LED is smaller in size compared with the light source using discharge and radiation, so that the LED has advantages in the applicability to increased applications, the ease of handling, the expectation of various designs, and the like. Thus, the LED is a light source having increased added values.

Furthermore, the LED is capable of controlling the radiation pattern of emitted light, in combination with an optical system having a reflection function and a lens function. Furthermore, if a LED chip measuring several mm per side is used, the chip can be considered as a small point light source, so that the optical system also can be miniaturized.

Meanwhile, when a white LED is formed by combining the LED chip with a wavelength converting layer including a phosphor that converts a wavelength of a part of light from the LED chip, the wavelength converting layer, as well as the LED chip, also is considered as a light-emitting portion. Accordingly, the light-emitting portion becomes larger in size than the LED chip.

In order to make the best possible use of an amount of light emitted from the light-emitting portion as light to be emitted from the light-emitting device, it is desirable that the optical system to be used has a sufficiently larger size than the light-emitting portion or that the light-emitting portion have sufficiently smaller dimensions than the optical system. In order to make the optical system as small as possible so as to achieve a smaller and thinner light-emitting device, the wavelength converting layer has to be as small as possible. As a known structure that makes the wavelength converting layer smaller in size, Patent Document 1 and Patent Document 2 below disclose a structure in which a resin paste in which a high concentration of phosphor is dispersed is used to form the wavelength converting layer three-dimensionally around the LED chip.

Patent Document 1: JP 2001-135861 A
Patent Document 2: U.S. Pat. No. 6,650,044

A general white LED obtains white light by synthesizing emitted light from the LED chip and converted light from the wavelength converting layer. Alternatively, the converted light from the wavelength converting layer may be white light. In the structure disclosed in Patent Documents 1 and 2, since a high concentration of phosphor is present around the LED chip, the emitted light from the LED chip and the converted light obtained by the phosphor are blocked by the phosphor, resulting in a smaller amount of light passing through the wavelength converting layer. Further, a part of the emitted light from the LED chip may be reflected by the phosphor and reabsorbed into the LED chip or absorbed into an electrode of the LED chip. Thus, the efficiency of extracting white light may be decreased.

In order to extract white light with high efficiency, the concentration of the phosphor may be reduced. However, this makes the wavelength converting layer and, accordingly, the optical system larger in size, thereby serving to hamper achieving the object of obtaining a smaller and thinner light-emitting device.

DISCLOSURE OF INVENTION

The present invention solves the above-mentioned conventional problem, and its object is to provide a light-emitting device that can be miniaturized and reduced in thickness easily and can prevent a decrease in the light extraction efficiency, and a method for manufacturing the same.

A light-emitting device according to the present invention includes: a base; a light-emitting element placed on the base; and a wavelength converting layer that covers the light-emitting element. The wavelength converting layer includes a wavelength converting portion that converts a wavelength of light from the light-emitting element, and a light guide portion made of a light-transmitting material. The light guide portion extends from a light-emitting element side to a light extraction side of the wavelength converting layer.

A first method for manufacturing a light-emitting device according to the present invention includes the steps of: placing a light-emitting element on a base; forming a wavelength converting material layer, made of a light-transmitting base material and a wavelength converting material dispersed in the light-transmitting base material, on the base so as to cover the light-emitting element; forming a groove or a hole that is concave toward the base from an end face of the wavelength converting material layer; and filling a light-transmitting material into the groove or the hole so as to form a wavelength converting layer including a light guide portion made of the light-transmitting material and a wavelength converting portion made of the light-transmitting base material and the wavelength converting material.

A second method for manufacturing a light-emitting device according to the present invention includes the steps of placing a light-emitting element on a base; forming a wavelength converting portion made of a light-transmitting base material and a wavelength converting material dispersed in the light-transmitting base material, in a concave portion of a mold that has the concave portion and a rod-like member formed on a bottom surface of the concave portion, so as to cover the rod-like member; adhering a principal surface of the base on which the light-emitting element is placed to an exposed surface of the wavelength converting portion; removing the wavelength converting portion from the mold; and filling a light-transmitting material into an interstice in which the rod-like member has been disposed so as to form a wavelength converting layer including a light guide portion made of the light-transmitting material and the wavelength converting portion.

A third method for manufacturing a light-emitting device according to the present invention includes the steps of: placing a light-emitting element on a base; forming a groove or a hole on one principal surface of a plate-like member made of a light-transmitting material; filling a paste made of a light-transmitting base material and a wavelength converting material dispersed in the light-transmitting base material into the groove or the hole so as to form a wavelength converting layer including a light guide portion made of the light-transmitting material and a wavelength converting portion made of the paste; and adhering a principal surface of the base on which the light-emitting element is placed to the wavelength converting layer so that the light guide portion extends from a light-emitting element side to a light extraction side of the wavelength converting layer.

A fourth method for manufacturing a light-emitting device according to the present invention includes the steps of: placing a light-emitting element on a base; forming a plurality of plate-like light guide portions made of a light-transmitting material; forming a plurality of plate-like wavelength converting portions made of a light-transmitting base material and a wavelength converting material dispersed in the light-transmitting base material; laminating the light guide portions and the wavelength converting portions alternately, followed by integration, so as to form a wavelength converting layer including the light guide portions and the wavelength converting portions; and adhering a principal surface of the base on which the light-emitting element is placed to the wavelength converting layer so that the light guide portions extend from a light-emitting element side to a light extraction side of the wavelength converting layer.

According to the light-emitting device of the present invention, the light guide portion made of the light-transmitting material is arranged in the wavelength converting layer, thereby preventing the light from the light-emitting element from being reflected by the wavelength converting material and reabsorbed into the light-emitting element. Further, the wavelength converting layer can be made smaller in size because there is no need to reduce the concentration of the wavelength converting material. Namely, according to the light-emitting device of the present invention, it is possible to provide a light-emitting device that can be miniaturized and reduced in thickness easily and can prevent a decrease in the light extraction efficiency.

According to the method for manufacturing the light-emitting device of the present invention, the above-described light-emitting device of the present invention can be manufactured efficiently.

DESCRIPTION OF THE INVENTION

Figure 1A:
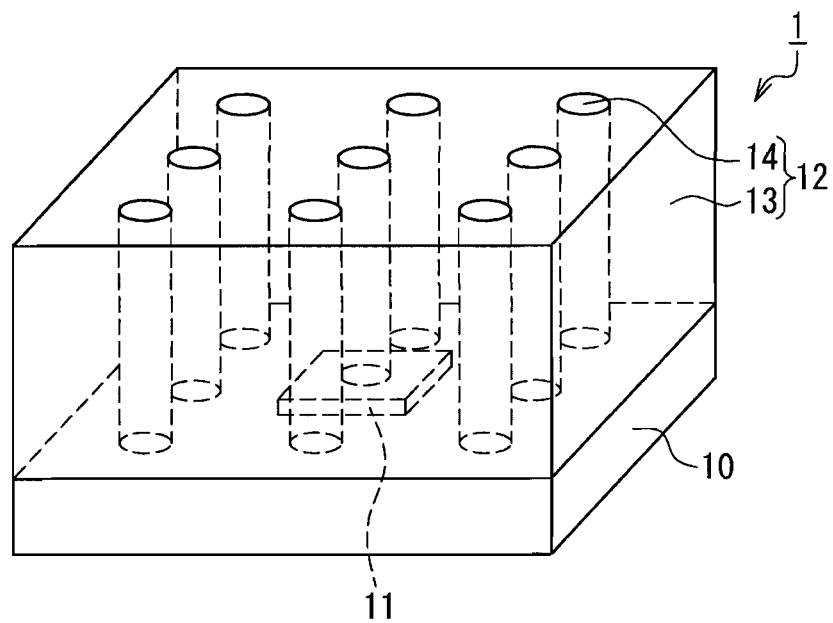
FIG. 1A is a schematic perspective view of a light-emitting device according to Embodiment 1 of the present invention.

The light-emitting device of the present invention includes a base, a light-emitting element placed on the base, and a wavelength converting layer that covers the light-emitting element. The light-emitting element is mounted on the base by flip-chip bonding or wire bonding, for example. The wavelength converting layer may not be in contact with the light-emitting element. The number of the light-emitting elements is not limited particularly, and may be set appropriately depending on the amount of light required.

The material of the base is not limited particularly. Examples of the material include the following: single crystals such as sapphire, Si, GaN, AlN, ZnO, SiC, BN, and ZnS; ceramics such as $Al_2O_3$, AlN, BN, MgO, ZnO, SiC, and C or a mixture thereof; metals such as Al, Cu, Fe, Au, and W or an alloy including these metals; glass epoxy; and resins such as epoxy resin, silicone resin, acrylic resin, urea resin, amide resin, imide resin, polycarbonate resin, polyphenylene sulfide resin, liquid crystal polymer, acrylonitrile-butadiene-styrene resin (ABS resin), methacrylic resin (PMMA resin), and cyclic olefin copolymer or a mixture thereof.

As the light-emitting element, for example, a blue LED that emits blue light with a wavelength of 420 to 500 nm, a blue green LED that emits blue green light with a wavelength of 500 to 530 nm, a blue violet LED that emits blue violet light with a wavelength of 380 to 420 nm, an ultraviolet LED that emits ultraviolet light with a wavelength of not more than 380 nm, or the like may be used. As the blue LED, the blue violet LED, and the ultraviolet LED, for example, a LED using an InGaAlN-based material can be used. The ratio of a combination of elements for the LED material in the light-emitting element in each system formed by epitaxial growth is adjusted appropriately in accordance with an emission wavelength.

The wavelength converting layer includes a wavelength converting portion that converts a wavelength of light from the light-emitting element, and a light guide portion made of a light-transmitting material. The wavelength converting portion is made of, for example, a light-transmitting base material and a wavelength converting material dispersed in the light-transmitting base material. The light guide portion extends from a light-emitting element side to a light extraction side of the wavelength converting layer, so as to guide the light from the light-emitting element or converted light from the wavelength converting portion to the light extraction side. With this configuration, it is possible to prevent the light from the light-emitting element from being reflected by the wavelength converting material and reabsorbed into the light-emitting element. Further, the wavelength converting layer can be made smaller in size because there is no need to reduce the concentration of the wavelength converting material. Namely, according to the light-emitting device of the present invention, it is possible to provide a light-emitting device that can be miniaturized and reduced in thickness easily and can prevent a decrease in the light extraction efficiency.

In the case where the wavelength converting portion is made of the light-transmitting base material and the wavelength converting material dispersed in the light-transmitting base material, the light-transmitting material for forming the light guide portion preferably has a refractive index equal to or higher than a refractive index of the light-emitting base material. When the refractive index of the light-transmitting material is equal to the refractive index of the light-transmitting base material, light refraction or reflection at an interface between the wavelength converting portion and the light guide portion can be prevented, resulting in improved light extraction efficiency. Also, when the refractive index of the light-transmitting material is higher than the refractive index of the light-transmitting base material, the light extraction efficiency can be improved. More specifically, since light gathers to a part having a high refractive index, the light from the light-emitting element and the converted light from the wavelength converting material can be gathered to the light guide portion so as to be wave-guided to the light extraction side of the wavelength converting layer easily. Thus, the light extraction efficiency can be improved.

The light-transmitting material for forming the light guide portion is not limited particularly, as long as it transmits light to be extracted from the light-emitting device, and examples thereof include the following: resins such as epoxy resin, silicone resin, acrylic resin, urea resin, amide resin, imide resin, polycarbonate resin, polyphenylene sulfide resin, liquid crystal polymer, acrylonitrile-butadiene-styrene resin (ABS resin), methacrylate resin (PMMA resin), and cyclic olefin copolymer or a mixture thereof, and glass such as glass made by a sol-gel method using metal alkoxide or colloidal silica as a starting material and low-melting glass. Furthermore, a composite material also can be used, which is obtained by using these light-transmitting materials as a base material, and dispersing metal oxide particles in the base material. In this case, by adjusting the amount of the metal oxide particles to be dispersed in the base material, the refractive index of the light guide portion can be adjusted, and a light-scattering effect can be obtained. Furthermore, in the case of using curable resin as a base material, if the metal oxide particles are dispersed in curable resin in an uncured state, the thixotropy of the curable resin before being cured is enhanced, so that the light guide portion can be formed easily in a desired shape. Furthermore, the heat conductivity is enhanced compared with the case of using resin alone, so that the heat from the light-emitting element can be released efficiently.

Further, the light guide portion for forming the wavelength converting layer also can be made of ceramics such as $Al_2O_3$, AlN, BN, MgO, ZnO, and SiC or a mixture thereof, or a phosphor material described later. Since the phosphor material does not emit light unless a rare earth element such as Ce and Eu is added thereto, it can be used as the material of the light guide portion. In the case of using the phosphor material for the light guide portion, when the phosphor material is of the same material system as that of the wavelength converting material, they have the same refractive index and thermal expansion coefficient, so that reflection at the interface between the wavelength converting portion and the light guide portion can be prevented, and cracks caused by thermal stress can be suppressed. Further, when the light guide portion is made of an inorganic material such as the ceramics, the phosphor material, and the glass material, the heat generated by the wavelength converting portion can be released more effectively via the base and the like, due to a higher heat conductivity of the inorganic material than that of the resin material.

As the metal oxide particles, $SiO_2$, $Al_2O_3$, ZnO, $Y_2O_3$, $TiO_2$, $ZrO_2$, $HfO_2$, $SnO_2$, $Ta_2O_3$, $Nb_2O_5$, $BaSO_4$, $V_2O_5$ or a mixture thereof can be used, and an average particle diameter thereof is preferably about 1 to 100 nm in order to adjust the refractive index and to improve the thixotropy. Further, in order to obtain the light-scattering effect, an average particle diameter of about 100 nm to 1 μm is preferable. Incidentally, the "average particle diameter" mentioned above may be an average value of particle diameters of primary particles (e.g., an average value of particle diameters of 100 primary particles) that are read out from an observed image of a scanning electron microscope, for example.

As the light-transmitting base material for forming the wavelength converting portion, the same materials as listed above for the light-transmitting material also can be used.

As the wavelength converting material, for example, a red phosphor that generates red light, an orange phosphor that generates orange light, a yellow phosphor that generates yellow light, a green phosphor that generates green light, or the like can be used. Examples of the red phosphor include the following: silicate-based $Ba_3MgSi_2O_8:Eu^{2+}$, $Mn^{2+}$; nitridosilicate-based $Sr_2Si_5N_8:Eu^{2+}$; nitridoaluminosilicate-based $CaAlSiN_3:Eu^{2+}$; oxonitridoaluminosilicate-based $Sr_2Si_4AlON_7:Eu^{2+}$; and sulfide-based $(Sr, Ca)S:Eu^{2+}$ and $La_2O_2S:Eu^{3+}$, $Sm^{3+}$. Examples of the orange phosphor include the following: silicate-based $(Sr, Ca)_2SiO_4:Eu^{2+}$; garnet-based $Gd_3Al_5O_{12}:Ce^{3+}$; and α-SIALON-based Ca-α-SiAlON:$Eu^{2+}$. Examples of the yellow phosphor include the following: silicate-based $(Sr, Ba)_2SiO_4:Eu^{2+}$ and $Sr_3SiO_5:Eu^{2+}$; garnet-based $(Y, Gd)_3Al_5O_{12}:Ce^{3+}$; sulfide-based $CaGa_2S_4:Eu^{2+}$; and α-SIALON-based Ca-α-SiAlON:$Eu^{2+}$. Examples of the green phosphor include the following: aluminate-based $BaMgAl_{10}O_{17}:Eu^{2+}$, $Mn^{2+}$ and $(Ba, Sr, Ca)Al_2O_4:Eu^{2+}$; silicate-based $(Ba, Sr)_2SiO_4:Eu^{2+}$; α-SIALON-based Ca-α-SiAlON:$Yb^{2+}$; β-SIALON-based $β-Si_3N_4:Eu^{2+}$; oxonitridosilicate-based $(Ba, Sr, Ca)Si_2O_2N_2:Eu^{2+}$; oxonitridoaluminosilicate-based $(Ba, Sr, Ca)_2Si_4AlON_7:Ce^{3+}$; sulfide-based $SrGa_2S_4:Eu^{2+}$, garnet-based $Y_3(Al, Ga)_5O_{12}:Ce^{3+}$, and oxide-based $CaSc_2O_4:Ce^{3+}$.

Moreover, in the case of using the blue violet LED or the ultraviolet LED as the light-emitting element, for example, the above-described phosphor may be used in combination with a blue phosphor that generates blue light or a blue green phosphor that generates blue green light. Examples of the blue phosphor include the following: aluminate-based $BaMgAl_{10}O_{17}:Eu^{2+}$; silicate-based $Ba_3MgSi_2O_8:Eu^{2+}$; and halophosphate-based $(Sr, Ba)_{10}(PO_4)_6Cl_2:Eu^{2+}$. Examples of the blue green phosphor include the following: aluminate-based $Sr_4Al_{14}O_{25}:Eu^{2+}$; and silicate-based $Sr_2Si_3O_8.2SrCl_2:Eu^{2+}$.

As the wavelength converting material, a metal complex, an organic dye, an organic pigment, a phosphorescent substance, or the like also can be used instead of the above-described phosphors. It is also possible to use a plurality of the wavelength converting materials in order to obtain a necessary color temperature and a necessary color rendering index. According to the present invention, even when the wavelength converting material has an external quantum efficiency of 90% or less at a peak wavelength of the light emitted from the light-emitting element (e.g., $(Sr, Ba)_2SiO_4:Eu^{2+}$ and $(Y, Gd)_3Al_5O_{13}:Ce^{3+}$ as described in JP 2006-49799 A), the above-described effect of the present invention can be achieved, resulting in a light-emitting device that is small and thin and has high light extraction efficiency.

In the light-emitting device according to the present invention, the light guide portion preferably has an end that protrudes from an end face on the light extraction side of the wavelength converting layer. With this configuration, the end face on the light extraction side of the wavelength converting layer has a concave-convex shape, so that total reflection on the end face on the light extraction side can be prevented, resulting in improved light extraction efficiency. In this case, the end preferably has a hemispherical shape or a conical shape for further improvement in the light extraction efficiency. In the above-described configuration, the ends to serve as convex portions preferably are provided at intervals of about 30 to 300 μm for easier improvement in the light extraction efficiency.

In the light-emitting device according to the present invention, the light guide portion may be arranged so as to extend outward radially from the light-emitting element to the light extraction side. With this arrangement, the wavelength converting material around the light-emitting element is reduced, thereby reliably preventing the light from the light-emitting element from being reflected by the wavelength converting material and reabsorbed into the light-emitting element, and suppressing color nonuniformity of the light to be extracted.

Hereinafter, embodiments of the present invention will be described with reference to the drawings. In the drawings to be referred to, components having substantially the same functions are denoted with the same reference numerals, and repeated descriptions may be omitted. For the purpose of making the drawings easier to understand, metal wiring, a feed terminal that is located outside the light-emitting device, and the like are not shown in the drawings.

Embodiment 1

Figure 1B:
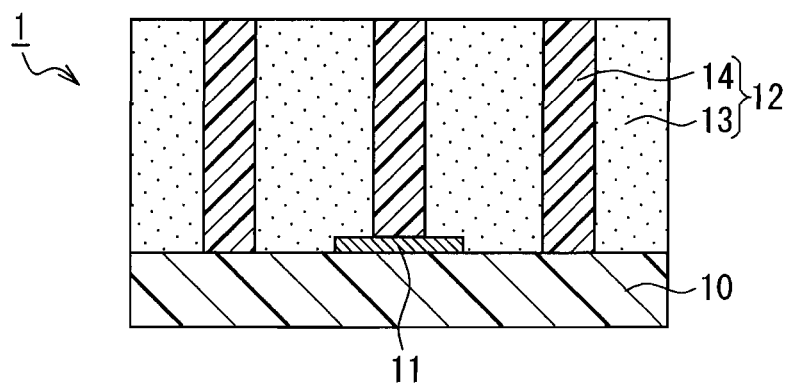
FIG. 1B is a schematic cross-sectional view of the light-emitting device shown in FIG. 1A.

FIG. 1A is a schematic perspective view showing a light-emitting device according to Embodiment 1 of the present invention, and FIG. 1B is a schematic cross-sectional view of the light-emitting device shown in FIG. 1A.

As shown in FIGS. 1A and 1B, a light-emitting device 1 includes a base 10, a light-emitting element 11 placed on the base 10, and a wavelength converting layer 12 that covers the light-emitting element 11. The wavelength converting layer 12 includes a wavelength converting portion 13 containing a wavelength converting material for converting a wavelength of light from the light emitting element 11, and nine light guide portions 14 made of a light-transmitting material. Each of the light guide portions 14 extends from a light-emitting element 11 side to a light extraction side (top surface) of the wavelength converting layer 12. With this configuration, it is possible to prevent the light from the light-emitting element 11 from being reflected by the wavelength converting material and reabsorbed into the light-emitting element 11. Further, the wavelength converting layer 12 can be made smaller in size because there is no need to reduce the concentration of the wavelength converting material. Namely, according to the light-emitting device 1, it is possible to provide a light-emitting device that can be miniaturized and reduced in thickness easily and can prevent a decrease in the light extraction efficiency. In FIG. 1A, the wavelength converting layer 12 has a quadratic prism shape. However, the shape of the wavelength converting layer 12 is not limited particularly, and it may be a cylindrical shape, a polygonal prism shape other than the quadratic prism shape, a conical shape, a polygonal pyramid shape, or the like. Further, in FIG. 1A, the light guide portions 14 are arranged in a three-by-three pattern. However, the number and the arrangement of the light guide portions 14 are not limited particularly, and they may be arranged at random.

Next, modified examples of the light-emitting device 1 according to Embodiment 1 will be described with reference to the schematic cross-sectional views in FIGS. 2A to 2D.

Figure 2A:
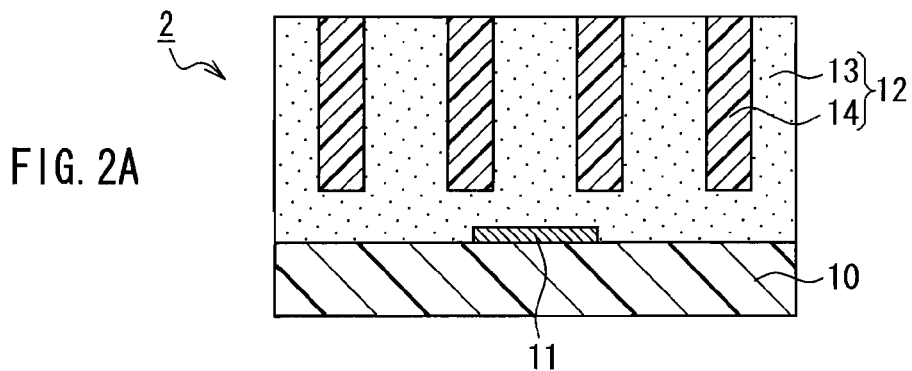
FIGS. 2A to 2D are schematic cross-sectional views showing modification examples of the light-emitting device according to Embodiment 1 of the present invention.

In a light-emitting device 2 shown in FIG. 2A, the light guide portions 14 (partially not shown) are arranged in a four-by-four pattern, and none of the light guide portions 14 is in contact with the light-emitting element 11 and the base 10. With this arrangement, in the case of using an ultraviolet LED as the light-emitting element 11, for example, it is possible to prevent ultraviolet light from the ultraviolet LED from being radiated directly from the light guide portions 14 to the outside. When an end portion of each of the light guide portions 14 on the light-emitting element 11 side has a convex lens shape or a concave lens shape, it becomes easier to gather the light from the light-emitting element 11 and converted light from the wavelength converting portion 13, resulting in improved light extraction efficiency.

Figure 2B:
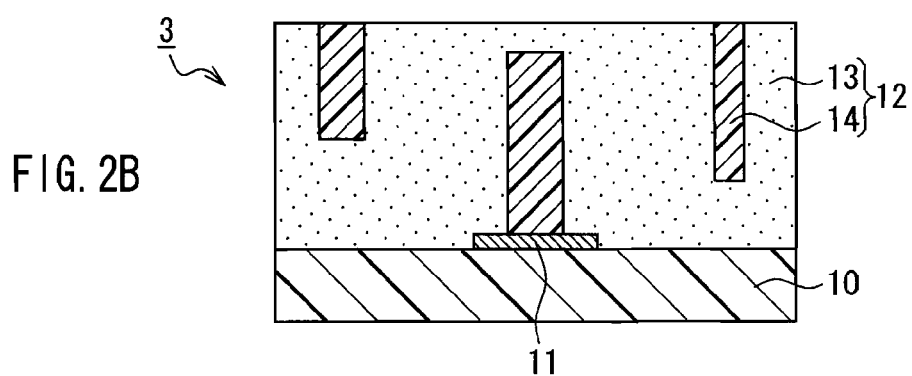

In a light-emitting device 3 shown in FIG. 2B, the light guide portions 14 have different lengths and thicknesses from one another. By adjusting the lengths and the thicknesses of the respective light guide portions 14 in this manner, it is possible to suppress nonuniformity in the illuminance of emitted light and nonuniformity in the luminescent color. Further, the light guide portion 14 that is in contact with the light-emitting element 11 is not exposed on the top surface of the wavelength converting layer 12. Thus, in the case of using an ultraviolet LED as the light-emitting element 11, for example, it is possible to prevent ultraviolet light from the ultraviolet LED from being radiated directly from the light guide portion 14 to the outside.

Figure 2C:
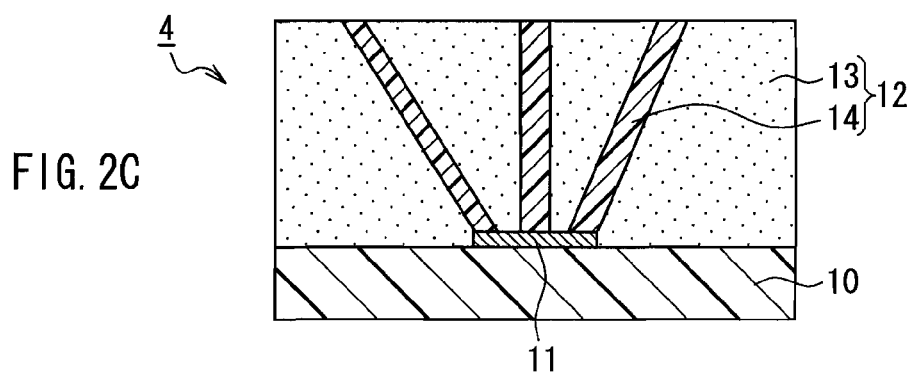

In a light-emitting device 4 shown in FIG. 2C, each of the light guide portions 14 is arranged so as to extend outward radially from the light-emitting element 11 to the light extraction side. With this arrangement, the wavelength converting material around the light-emitting element 11 is reduced, thereby reliably preventing the light from the light-emitting element 11 from being reflected by the wavelength converting material and reabsorbed into the light-emitting element 11, and suppressing color nonuniformity of the light to be extracted.

Figure 2D:
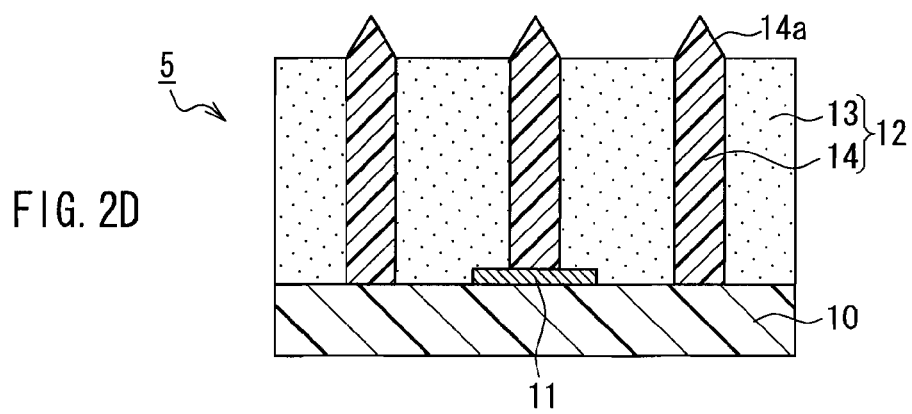

In a light-emitting device 5 shown in FIG. 2D, each of the light guide portions 14 has an end 14a that protrudes conically from an end face on the light extraction side of the wavelength converting layer 12. With this configuration, the end face on the light extraction side of the wavelength converting layer 12 has a concave-convex shape, so that total reflection on the end face on the light extraction side can be prevented, resulting in improved light extraction efficiency. Although the end 14a has a conical shape in the example shown in FIG. 2D, the end 14a may have another shape (e.g., a hemispherical shape).

Embodiment 2

Figure 3A:
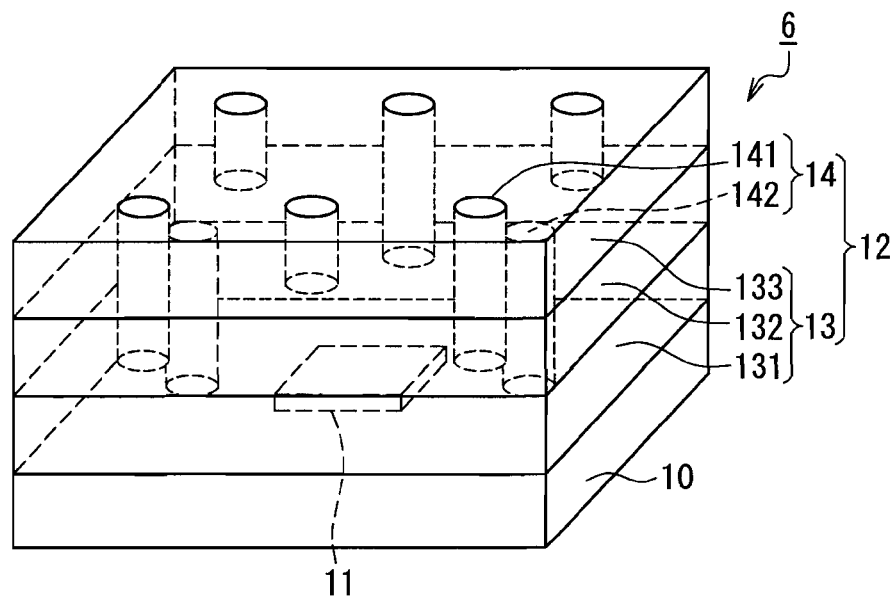
FIG. 3A is a schematic perspective view of a light-emitting device according to Embodiment 2 of the present invention.
Figure 3B:
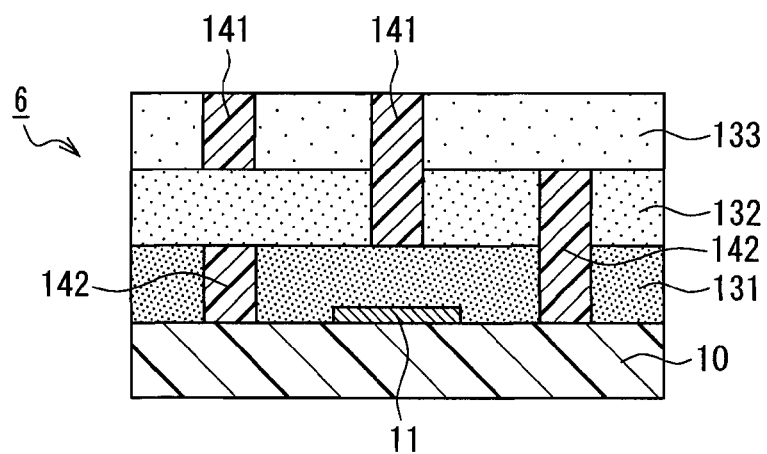
FIG. 3B is a schematic cross-sectional view of the light-emitting device shown in FIG. 3A.

FIG. 3A is a schematic perspective view showing a light-emitting device according to Embodiment 2 of the present invention, and FIG. 3B is a schematic cross-sectional view of the light-emitting device shown in FIG. 3A.

As shown in FIGS. 3A and 3B, in a light-emitting device 6, the wavelength converting layer 13 has a three-layer structure, in which a red phosphor layer 131, a green phosphor layer 132, and a blue phosphor layer 133 are laminated sequentially from a base 10 side. Further, an ultraviolet LED is used as the light-emitting element 11. With this configuration, it is possible to prevent a phosphor in the red phosphor layer 131 from being excited by green light from the green phosphor layer 132 and to prevent a phosphor in the red phosphor layer 131 and a phosphor in the green phosphor layer 132 from being excited by blue light from the blue phosphor layer 133. Consequently, the luminous efficiency can be improved. Further, the light guide portion 14 includes a light guide portion 141 for light extraction and a light guide portion 142 for excitation light, thereby suppressing a chromaticity shift of the emitted light.

Embodiment 3

Next, a method for manufacturing a light-emitting device according to Embodiment 3 of the present invention will be described with reference to the drawings. FIGS. 4A to 4C and FIGS. 5A and 5B to be referred to are cross-sectional views showing process steps in the method for manufacturing the light-emitting device according to Embodiment 3. Note here that the method for manufacturing the light-emitting device according to Embodiment 3 is a preferred example of a method for manufacturing the above-described light-emitting device 2 (see FIG. 2A).

Figure 4A:
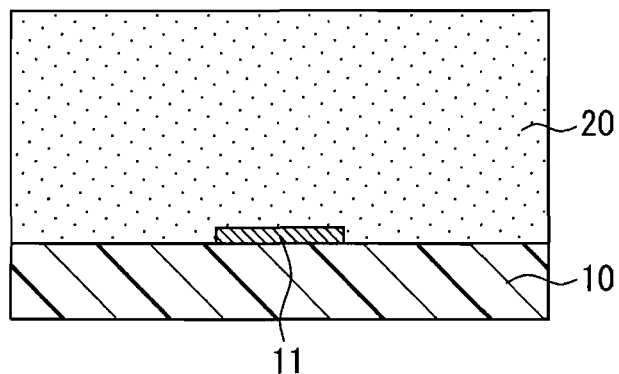
FIGS. 4A to 4C are cross-sectional views showing process steps in a method for manufacturing a light-emitting device according to Embodiment 3 of the present invention.

Initially, as shown in FIG. 4A, the light-emitting element 11 is placed on the base 10. Then, a wavelength converting material layer 20 made of a light-transmitting base material and a wavelength converting material dispersed in the light-transmitting base material is formed on the base 10 by screen printing or the like so as to cover the light-emitting element 11.

Figure 4B:
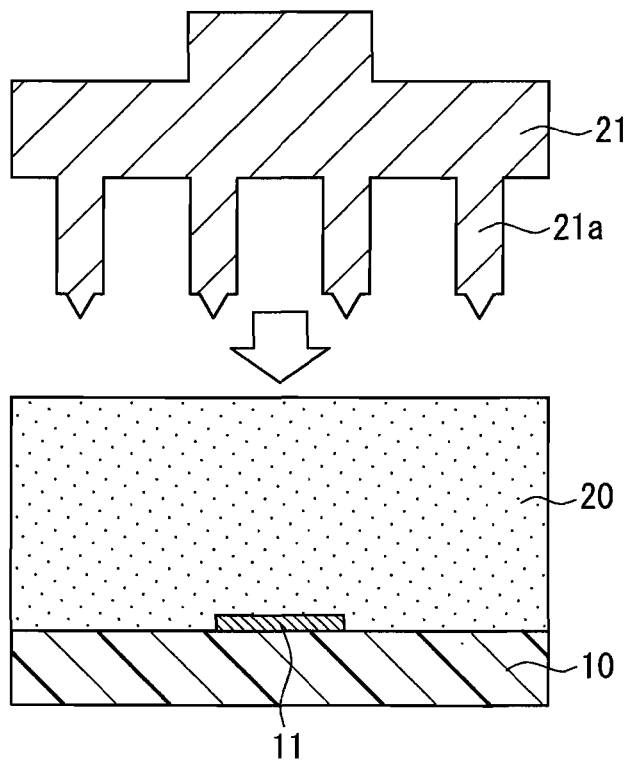
Figure 4C:
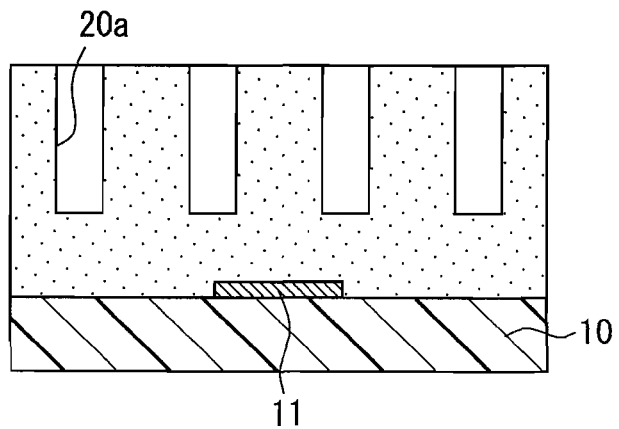

Then, as shown in FIG. 4B, a jig 21 with rod-like members 21a is used to pierce the wavelength converting material layer 20 to form holes 20a shown in FIG. 4C. Each of the rod-like members 21a has a diameter of about 10 to 200 μm, for example. The jig 21 may be made of a material such as glass, resin, and metal.

Figure 5A:
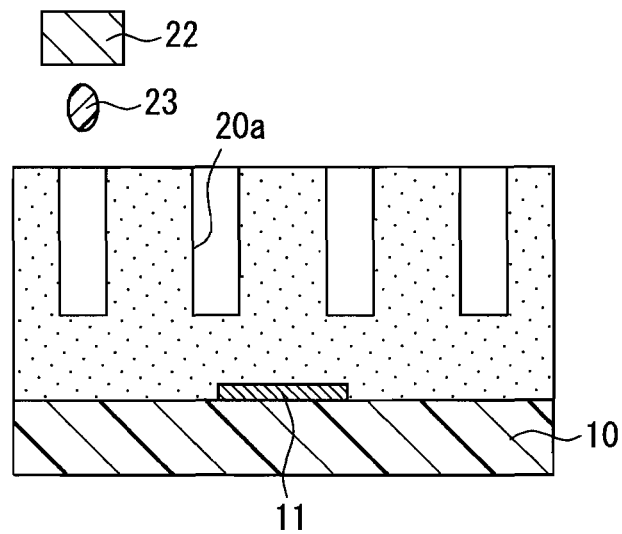
FIGS. 5A and 5B are cross-sectional views showing process steps in the method for manufacturing the light-emitting device according to Embodiment 3 of the present invention.
Figure 5B:
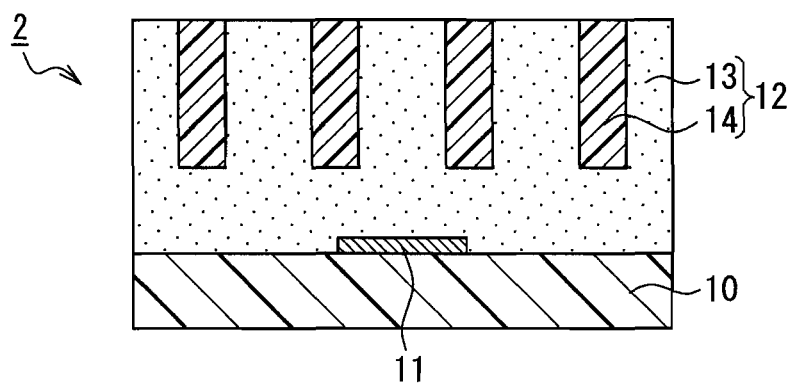

Thereafter, as shown in FIG. 5A, a nozzle 22 of a dispenser, an ink jet printing machine, or the like is used to fill a light-transmitting material 23 (e.g., a thermosetting resin) into the holes 20a in vacuum, followed by curing the light-transmitting material 23. As a result, as shown in FIG. 5B, the wavelength converting layer 12 including the light guide portions 14 made of the light-transmitting material 23 and the wavelength converting portion 13 made of the light-transmitting base material and the wavelength converting material is formed, so that the light-emitting device 2 is obtained. In the above-described process step in FIG. 4B, it is possible to form grooves in the wavelength converting material layer 20 by using a dicing blade, so as to form the light guide portions 14 in the grooves.

Embodiment 4

Next, a method for manufacturing a light-emitting device according to Embodiment 4 of the present invention will be described with reference to the drawings. FIGS. 6A to 6D and FIGS. 7A and 7B to be referred to are cross-sectional views showing process steps in the method for manufacturing the light-emitting device according to Embodiment 4. Note here that the method for manufacturing the light-emitting device according to Embodiment 4 is another preferred example of the method for manufacturing the above-described light-emitting device 2 (see FIG. 2A).

Figure 6A:
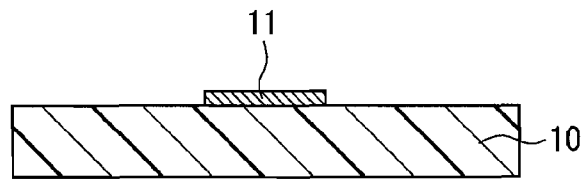
FIGS. 6A to 6D are cross-sectional views showing process steps in a method for manufacturing a light-emitting device according to Embodiment 4 of the present invention.

Initially, as shown in FIG. 6A, the light-emitting element 11 is placed on the base 10.

Figure 6B:
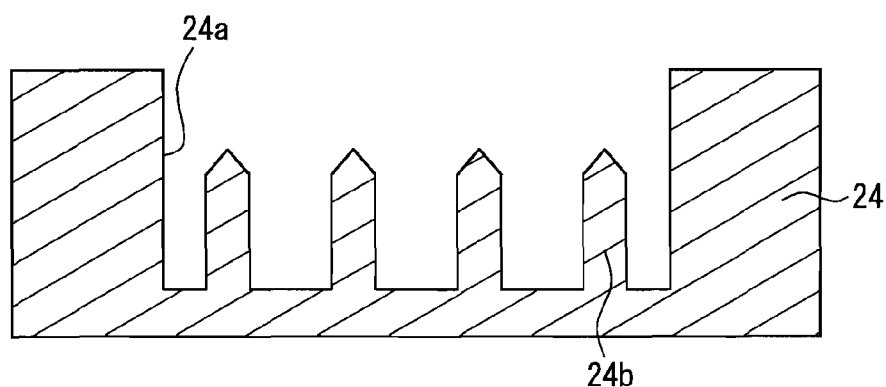

Then, a mold 24 as shown in FIG. 6B is prepared. The mold 24 includes a concave portion 24a and rod-like members 24b formed on a bottom surface of the concave portion 24a. Each of the rod-like members 24b has a diameter of about 10 to 200 μm, for example. The mold 24 may be made of a material such as glass, resin, and metal.

Figure 6C:
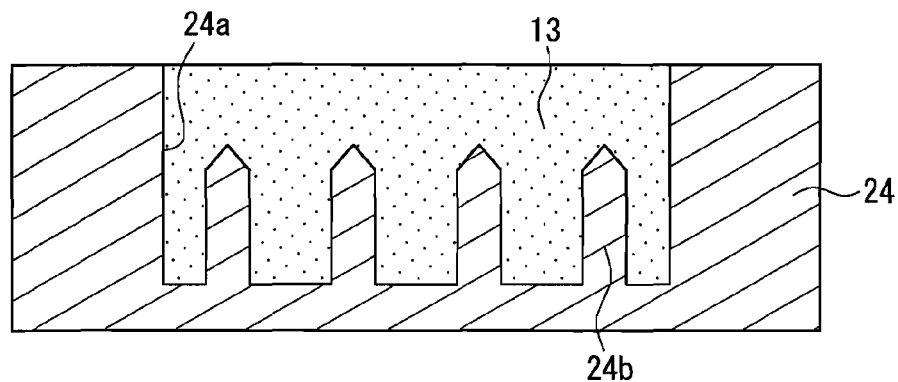

Then, as shown in FIG. 6C, the wavelength converting portion 13 is formed in the concave portion 24a so as to cover the rod-like members 24b. The wavelength converting portion 13 may be formed by filling a paste containing a light-transmitting base material and a wavelength converting material dispersed in the light-transmitting base material into the concave portion 24a, for example.

Figure 6D:
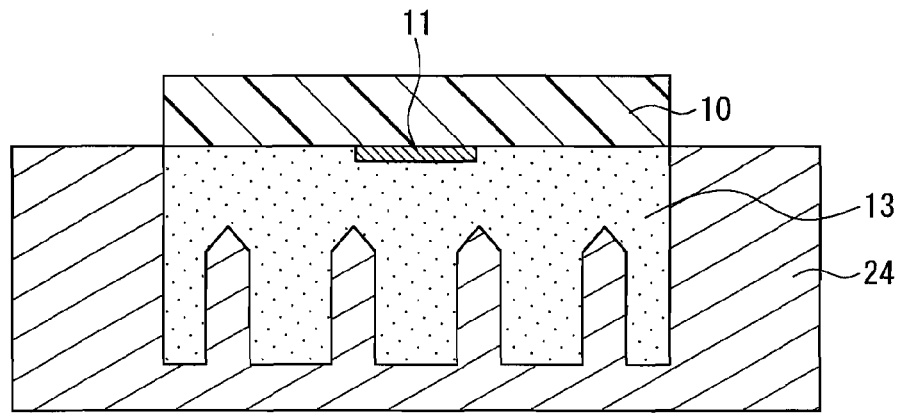

Thereafter, as shown in FIG. 6D, a principal surface of the base 10 on which the light-emitting element 11 is placed is adhered to an exposed surface of the wavelength converting portion 13. For example, the principal surface and the exposed surface may be brought into contact with each other before the above-described paste for forming the wavelength converting portion 13 is cured, followed by curing the paste.

Figure 7A:
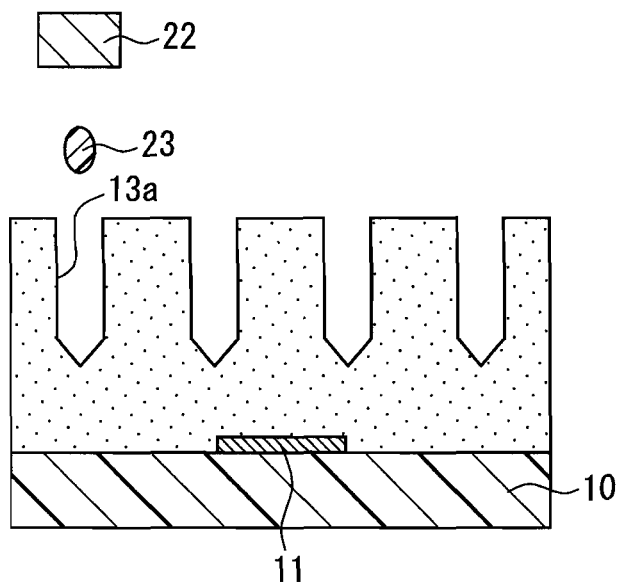
FIGS. 7A and 7B are cross-sectional views showing process steps in the method for manufacturing the light-emitting device according to Embodiment 4 of the present invention.
Figure 7B:
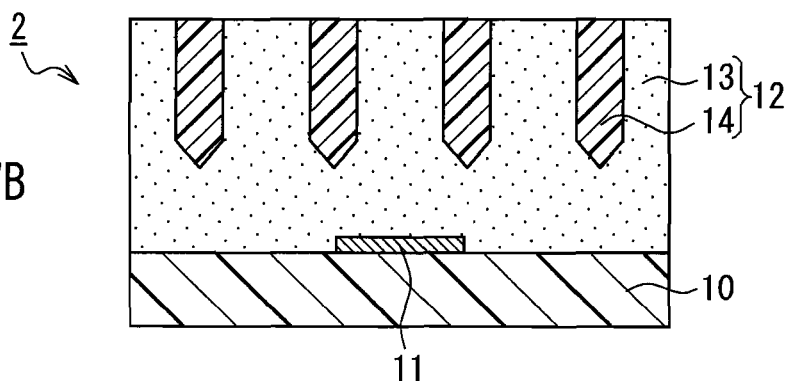

After that, the wavelength converting portion 13 is removed from the mold 24, and as shown in FIG. 7A, the light-transmitting material 23 (e.g., a thermosetting resin) is filled into interstices 13a in which the rod-like members 24b have been disposed, by using the nozzle 22 of a dispenser, an ink jet printing machine, or the like, followed by curing the light-transmitting material 23. As a result, as shown in FIG. 7B, the wavelength converting layer 12 including the light guide portions 14 made of the light-transmitting material 23 and the wavelength converting portion 13 is formed, so that the light-emitting device 2 is obtained.

Embodiment 5

Figure 8:
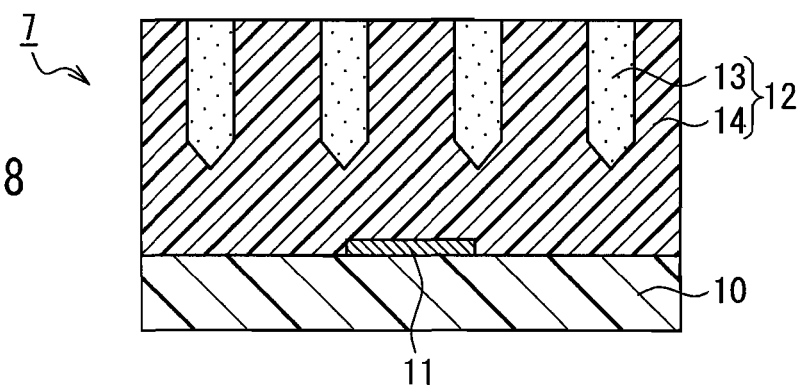
FIG. 8 is a schematic cross-sectional view of a light-emitting device according to Embodiment 5 of the present invention.

FIG. 8 is a schematic cross-sectional view of a light-emitting device according to Embodiment 5 of the present invention.

As shown in FIG. 8, in a light-emitting device 7, a plurality of the wavelength converting portions 13 are formed inside the light guide portion 14. Other configurations are the same as those of the above-described light-emitting device 2 (see FIG. 2A). The light-emitting device 7 also can achieve the same effect as that of the light-emitting device 2.

Embodiment 6

Next, a method for manufacturing a light-emitting device according to Embodiment 6 of the present invention will be described with reference to the drawings. FIGS. 9A to 9E to be referred to are cross-sectional views showing process steps in the method for manufacturing the light-emitting device according to Embodiment 6. Note here that the method for manufacturing the light-emitting device according to Embodiment 6 is a preferred example of a method for manufacturing the above-described light-emitting device 7 (see FIG. 8).

Figure 9A:
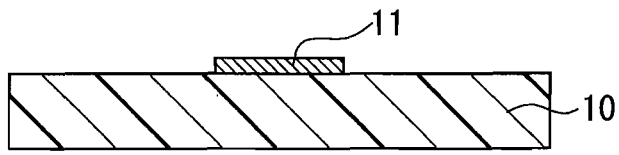
FIGS. 9A to 9E are cross-sectional views showing process steps in a method for manufacturing a light-emitting device according to Embodiment 6 of the present invention.

Initially, as shown in FIG. 9A, the light-emitting element 11 is placed on the base 10.

Figure 9B:
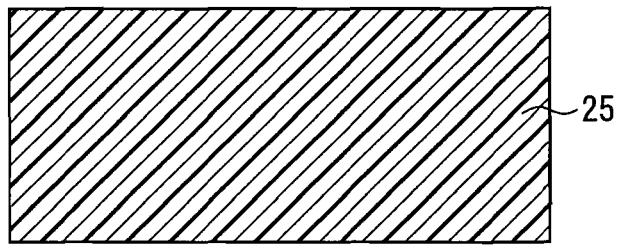

Then, a plate-like member 25 made of a light-transmitting material is prepared as shown in FIG. 9B.

Figure 9C:
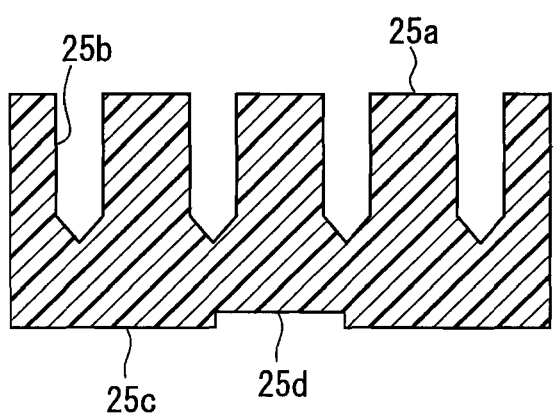

Then, as shown in FIG. 9C, holes 25b are formed on a principal surface 25a of the plate-like member 25 by laser beam machining or etching. Thereafter, a cavity 25d for the reception of the light-emitting element 11 is formed on a principal surface 25c on a side opposite to the principal surface 25a by laser beam machining or etching.

Figure 9D:
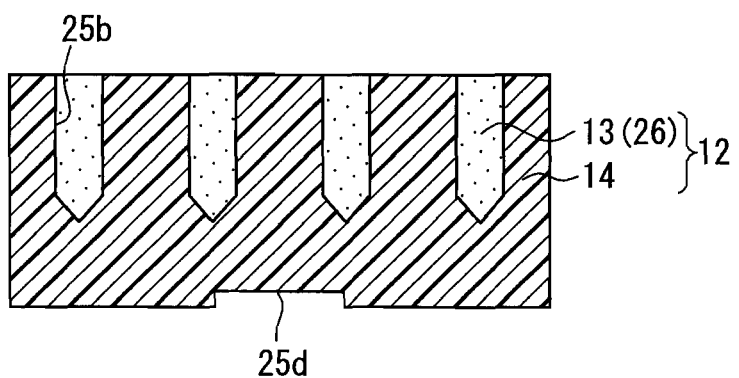

Then, as shown in FIG. 9D, a paste 26 made of a light-transmitting base material and a wavelength converting material dispersed in the light-transmitting base material is filled into the holes 25b from a nozzle of a dispenser, an ink jet printing machine, or the like. As a result, the wavelength converting layer 12 including the wavelength converting portion 13 made of the paste 26 and the light guide portion 14 made of the light-transmitting material is formed. By changing the kind of the wavelength converting material contained in the paste 26 to be dropped from the nozzle, the wavelength converting material to be filled can be changed in a depth direction of the wavelength converting portion 13.

In the case of using the ceramics or the phosphor material as described above as the material for the light guide portion 14, a sintering process is required to mold the material. Thus, it is effective to form the light guide portion 14 from the plate-like member 25 molded separately as described above.

Figure 9E:
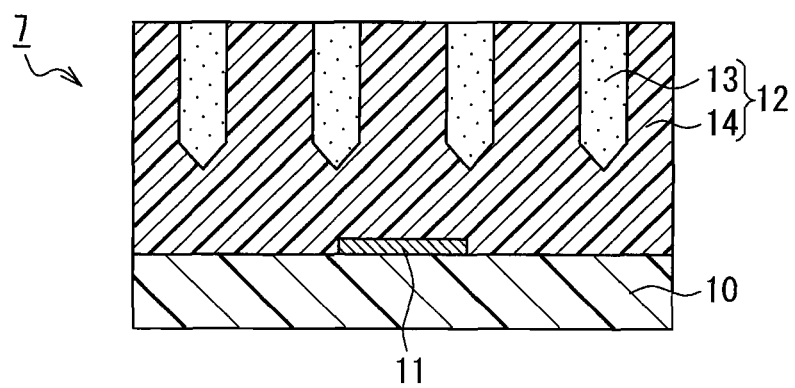

Then, as shown in FIG. 9E, the base 1 and the wavelength converting layer 12 are adhered to each other with an adhesive or the like with the light-emitting element 11 received in the cavity 25d, so that the light-emitting device 7 is obtained.

The adhesive may be not only an organic adhesive in general use such as an epoxy adhesive and a silicone adhesive, but also an inorganic adhesive. Examples of the inorganic adhesive include the following: metal materials as a solder material such as Sn, Au, In, Pb, Bi, Ag, and Al or an alloy material thereof, and metal oxides such as $SiO_2$, $Al_2O_3$, ZnO, $Y_2O_3$, $TiO_2$, $ZrO_2$, $HfO_2$, $SnO_2$, $Ta_2O_3$, $Nb_2O_5$, $BaSO_4$, ZnS, and $V_2O_5$ or a mixture thereof. In particular, when the plate-like member 25 is made of the ceramics or the phosphor material as described above, it is effective to use the inorganic adhesive.

Embodiment 7

Figure 10A:
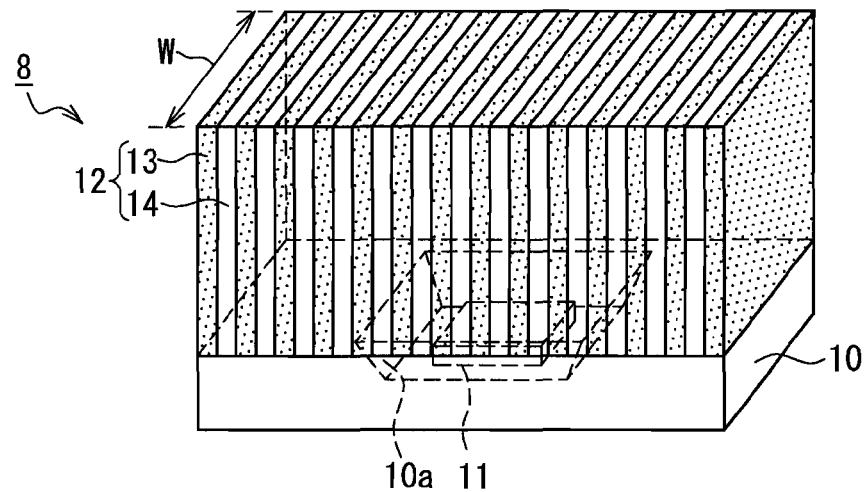
FIG. 10A is a schematic perspective view of a light-emitting device according to Embodiment 7 of the present invention.
Figure 10B:
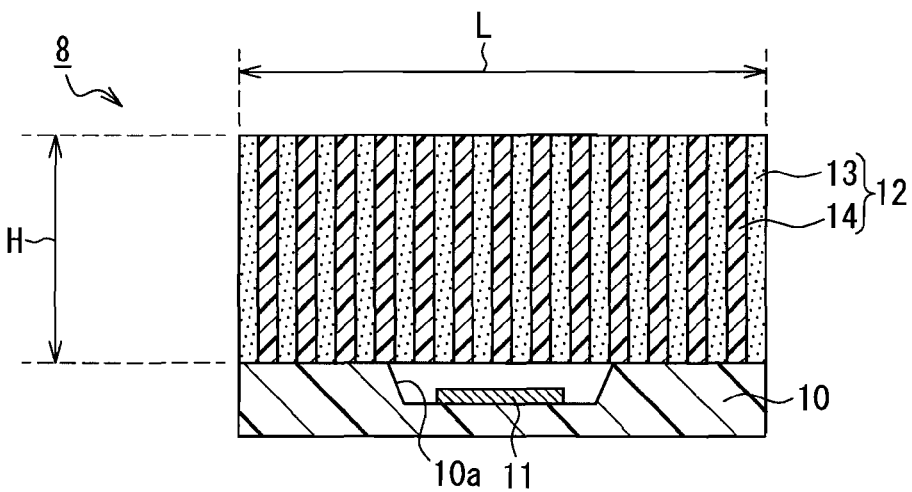
FIG. 10B is a schematic cross-sectional view of the light-emitting device shown in FIG. 10A.

FIG. 10A is a schematic perspective view of a light-emitting device according to Embodiment 7 of the present invention, and FIG. 10B is a schematic cross-sectional view of the light-emitting device shown in FIG. 10A.

Figure 11A:
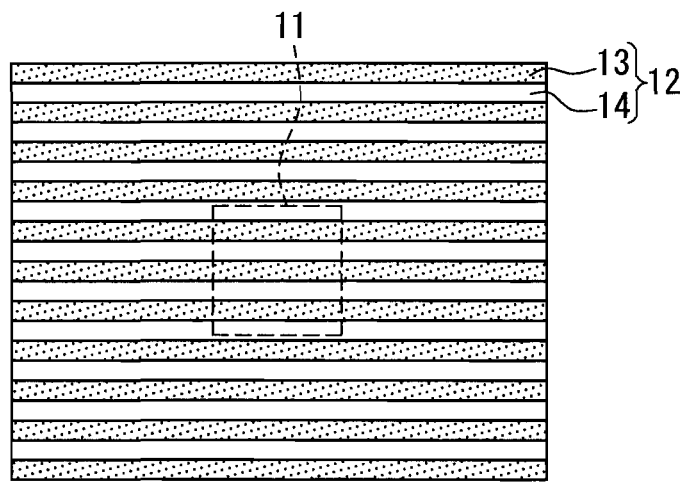
FIGS. 11A and 11B are schematic top views showing modification examples of the light-emitting device according to Embodiment 7 of the present invention.
Figure 11B:
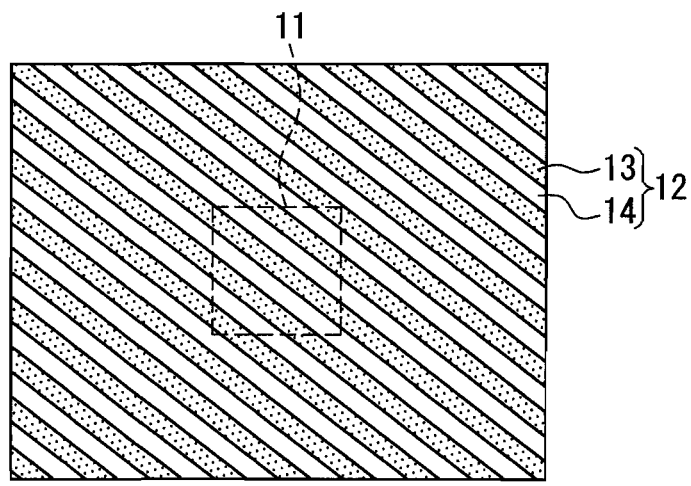

As shown in FIGS. 10A and 10B, in a light-emitting device 8, the wavelength converting layer 12 is formed in which the plate-like wavelength converting portions 13 and the plate-like light guide portions 14 are laminated. Both the wavelength converting portions 13 and the light guide portions 14 are perpendicular to the base 10. Further, as shown in FIG. 10B, the light-emitting element 11 is placed on a bottom surface of a concave portion 10a formed in the base 10, and the concave portion 10a is filled with, for example, an inert gas such as nitrogen or a sealing resin such as epoxy resin (not shown). The wavelength converting layer 12 may have a width W (see FIG. 10A) of about 1.5 mm, for example. Further, the wavelength converting layer 12 may have a height H (see FIG. 10B) and a length L (see FIG. 10B) of about 1.5 mm and about 3 mm, respectively, for example. In this case, the light-emitting element 11 can have a size of about 1 mm per side and a thickness of about 100 to 300 μm. The arrangement of the wavelength converting portions 13 and the light guide portions 14 is not limited to that shown in FIGS. 10A and 10B. For example, the wavelength converting portions 13 and the light guide portions 14 may be arranged as shown in the schematic top views in FIGS. 11A and 11B.

Further, a plurality of the light-emitting elements 11 may be placed on the bottom surface of the concave portion 10a.

Embodiment 8

Next, a method for manufacturing a light-emitting device according to Embodiment 8 of the present invention will be described with reference to the drawings. FIGS. 12A to 12C and FIGS. 13A and 13B to be referred to are cross-sectional views showing process steps in the method for manufacturing the light-emitting device according to Embodiment 8. Note here that the method for manufacturing the light-emitting device according to Embodiment 8 is a preferred example of a method for manufacturing the above-described light-emitting device 8 (see FIGS. 10A and 10B).

Figure 12A:
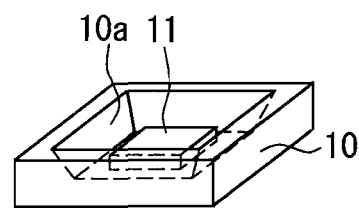
FIGS. 12A to 12C are cross-sectional views showing process steps in a method for manufacturing a light-emitting device according to Embodiment 8 of the present invention.

Initially, as shown in FIG. 12A, the light-emitting element 11 is placed on a bottom surface of the concave portion 10a formed in the base 10.

Figure 12B:
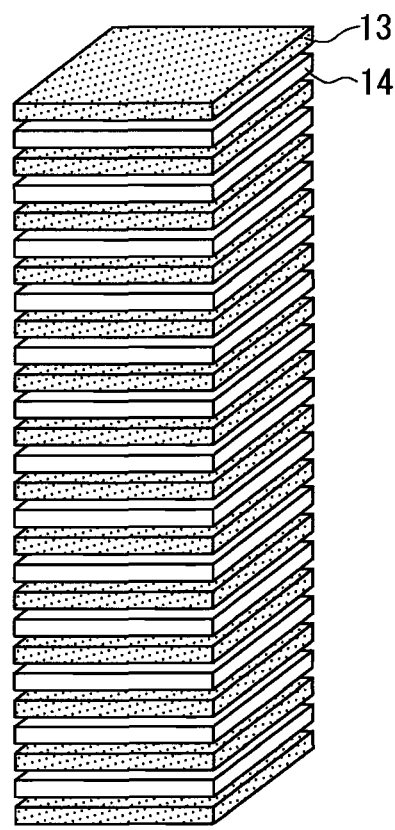
Figure 12C:
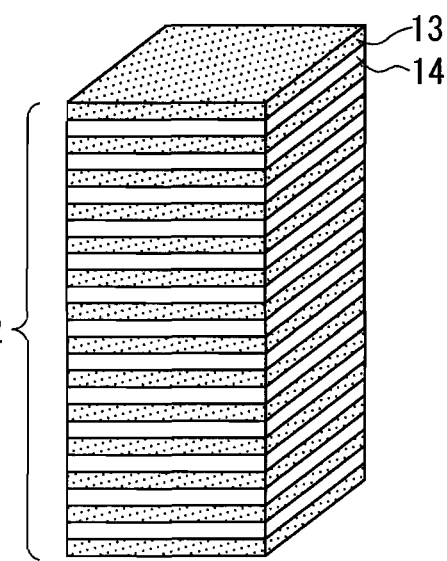

Then, as shown in FIG. 12B, a plurality of the plate-like wavelength converting portions 13 made of a light-transmitting base material and a wavelength converting material dispersed in the light-transmitting base material are formed, and a plurality of the plate-like light guide portions 14 made of a light-transmitting material (e.g., a semi-cured thermosetting resin) are formed. Thereafter, as shown in FIG. 12C, the wavelength converting portions 13 and the light guide portions 14 are laminated alternately, and then are integrated together by curing the light-transmitting material completely, thereby forming the wavelength converting layer 12 including the wavelength converting portions 13 and the light guide portions 14. When the wavelength converting portions 13 and the light guide portions 14 formed to have a larger area are used, by integrating them similarly and then separating the integrated body into a plurality of pieces with a dicing blade or the like, the wavelength converting layer 12 can be mass-produced easily.

When the wavelength converting layer 12 is made of an inorganic material such as ceramics and a phosphor material, the wavelength converting layer 12 can be produced by laminating a green sheet to serve as the light guide portion 14 and a green sheet to serve as the wavelength converting portion 13 alternately, followed by integration.

Figure 13A:
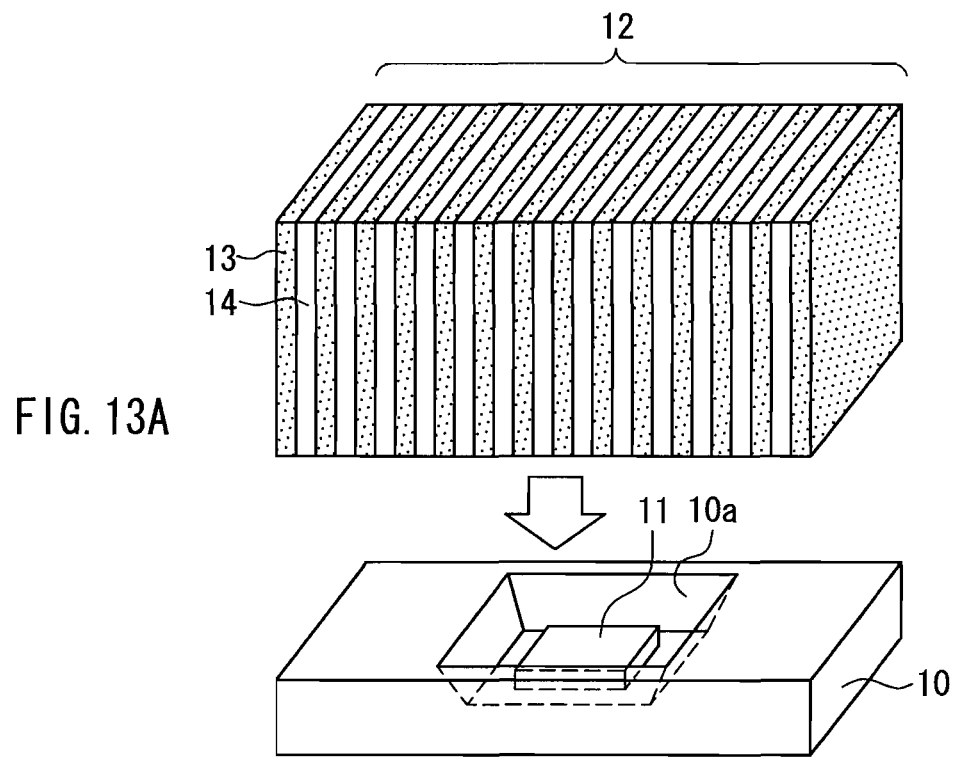
FIGS. 13A and 13B are cross-sectional views showing process steps in the method for manufacturing the light-emitting device according to Embodiment 8 of the present invention.
Figure 13B:
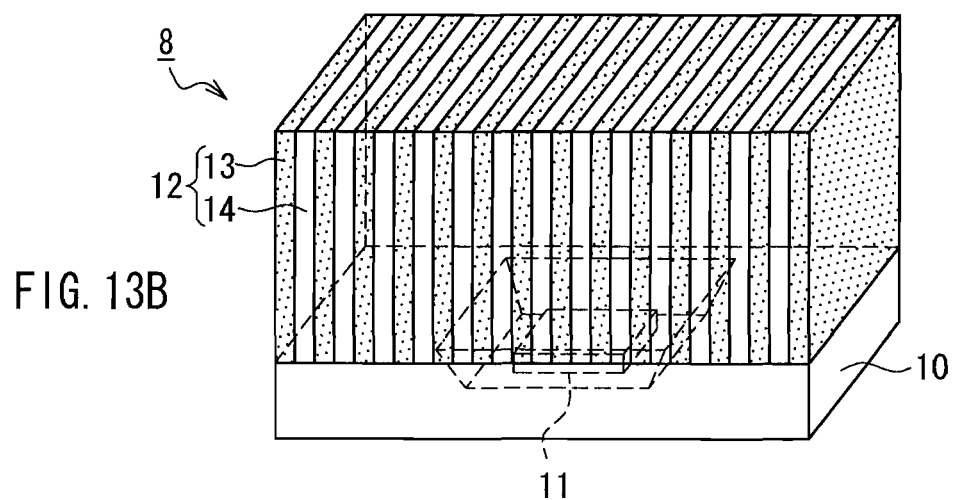

Then, as shown in FIG. 13A, the wavelength converting layer 12 is adhered to a principal surface of the base 10 on which the light-emitting element 11 is placed with a sealing resin such as epoxy resin. At this time, the wavelength converting portions 13 and the light guide portions 14 are made perpendicular to the base 10. As a result, the light-emitting device 8 shown in FIG. 13B is obtained. By selecting the wavelength converting portions 13 appropriately in accordance with an emission wavelength of the light-emitting element 11, synthesized light (white light) with designed chromaticity can be obtained.

When the wavelength converting layer 12 is made of an inorganic material such as ceramics, a phosphor material, and a glass material, the base 10 and the wavelength converting layer 12 may be adhered to each other with the inorganic adhesive as described above. The inorganic adhesive has an advantage in heat release due to its higher heat conductivity than that of the resin material.

Embodiment 9

Figure 14:
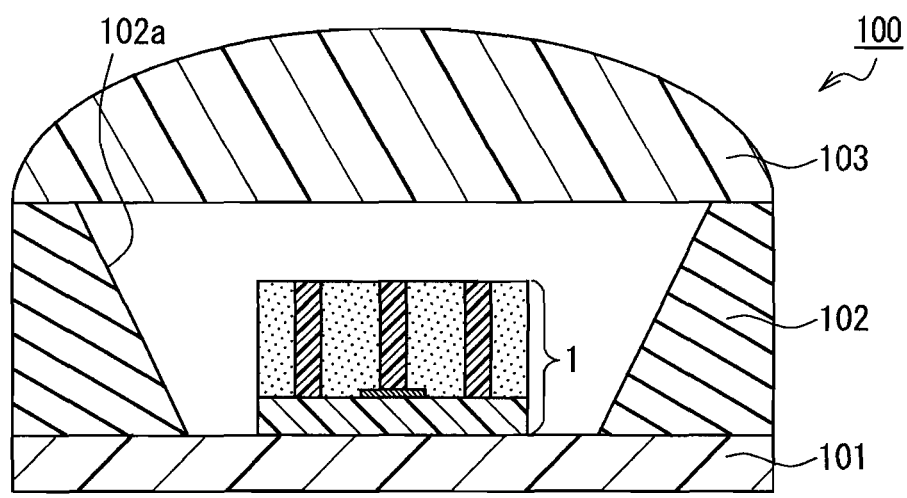
FIG. 14 is a schematic cross-sectional view of a light-emitting device according to Embodiment 9 of the present invention.

FIG. 14 is a schematic cross-sectional view of a light-emitting device according to Embodiment 9 of the present invention.

As shown in FIG. 14, a light-emitting device 100 according to Embodiment 9 has an optical system in addition to the above-described light-emitting device 1 (see FIGS. 1A and 1B) according to Embodiment 1. In the light-emitting device 100, a reflection plate 102 made of metal such as aluminum, ceramic such as alumina, or the like is placed on a main substrate 101 made of resin or the like, and the light-emitting device 1 is placed in a concave portion 102a of the reflection plate 102. Further, a lens 103 is provided so as to cover an opening of the concave portion 102a. With the optical system provided in this manner, it is possible to control the radiation pattern of emitted light. The concave portion 102a is filled with, for example, an inert gas such as nitrogen or a sealing resin such as epoxy resin (not shown).

Figure 15:
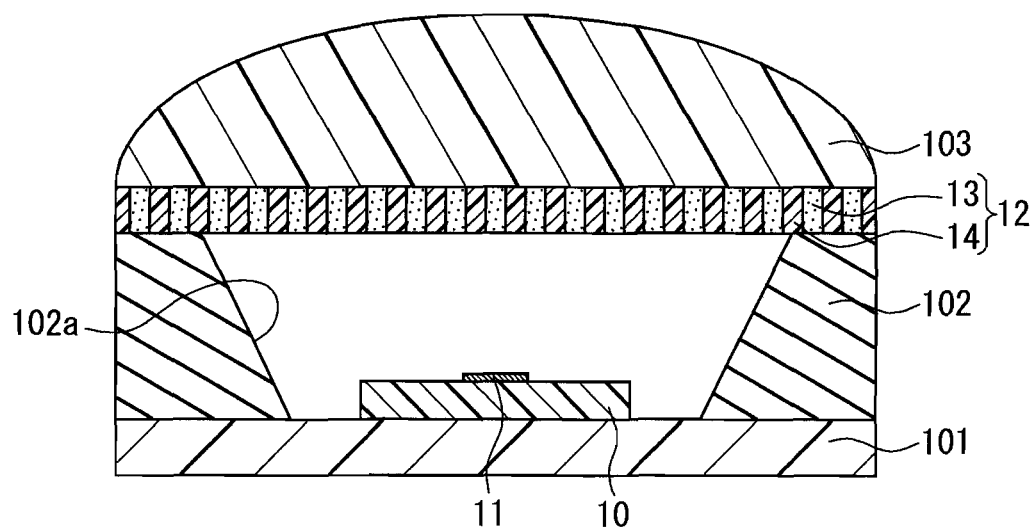
FIG. 15 is a schematic cross-sectional view showing a modification example of the light-emitting device according to Embodiment 9 of the present invention.

Although the above description is directed to the light-emitting device of the present invention having the optical system, the present invention is not limited thereto. For example, as shown in FIG. 15, the wavelength converting layer 12 may be provided on the opening of the concave portion 102a. This keeps the light-emitting element 11 from contact with the wavelength converting layer 12, thereby reliably preventing light from being reabsorbed into the light-emitting element 11. Further, the number of the light-emitting elements 11 on the base 10 is not limited particularly, and a plurality of the light-emitting elements 11 may be provided.

The present invention can be carried out in embodiments other than the above-described embodiments within a scope not departing from the spirit of the present invention. The embodiments disclosed in the present application are described merely for an illustrative purpose, and the present invention is not limited thereto. The scope of the present invention is to be interpreted by placing priority on the attached claims, rather than the above description in the specification, and all the changes within the scope equivalent to that of the claims are included in the claims.

INDUSTRIAL APPLICABILITY

The light-emitting device of the present invention is useful in, for example, an illumination apparatus used for general illumination, illumination for performance (spotlight, a sign lamp, or the like), illumination for automobiles (in particular, a headlight) or the like, and a display apparatus used in a display, a projector or the like. Furthermore, the light-emitting device of the present invention also is useful as a light source for a sensor requiring miniaturization and a thickness reduction.

The invention claimed is:

1. A light-emitting device, comprising:
a base;
a light-emitting element placed on the base; and
a wavelength converting layer that is placed on the base and covers the light-emitting element,
wherein the light-emitting element and the wavelength converting layer are in direct physical contact with each other,
the wavelength converting layer includes a single wavelength converting portion that converts a wavelength of light from the light-emitting element, and a plurality of light guide portions made of a light-transmitting material, each of which is entirely surrounded by the single wavelength converting portion when viewed from a light-emitting direction,
the plurality of light guide portions include at least one light guide portion that does not extend through two different surfaces of the wavelength converting layer,
sides of each of the plurality of light guide portions are surrounded by the single wavelength converting portion,
each of the light guide portions is free from a wavelength converting material, and extends to a light extraction side of the wavelength converting layer,
the single wavelength converting portion is made of a light-transmitting base material and a wavelength converting material dispersed in the light-transmitting base material, and
the light-transmitting material for forming the light guide portions has a refractive index higher than a refractive index of the light-transmitting base material.

2. The light-emitting device according to claim 1, wherein the wavelength converting material has an external quantum efficiency of 90% or less at a peak wavelength of the light emitted from the light-emitting element.

3. The light-emitting device according to claim 1, wherein the light guide portions have an end that protrudes from an end face on the light extraction side of the wavelength converting layer.

4. The light-emitting device according to claim 3, wherein the end that protrudes from the end face on the light extraction side of the wavelength converting layer has a hemispherical shape or a conical shape.

5. The light-emitting device according to claim 1, wherein at least one of the light guide portions is arranged so as to extend outward radially from the light-emitting element to the light extraction side.

6. The light emitting device according to claim 1, wherein the light guide portions extend to the light emitting element side of the wavelength converting layer.

* * * * *